(12) United States Patent
Srinivasan et al.

(10) Patent No.: US 10,032,508 B1
(45) Date of Patent: Jul. 24, 2018

(54) METHOD AND APPARATUS FOR MULTI-LEVEL SETBACK READ FOR THREE DIMENSIONAL CROSSPOINT MEMORY

(71) Applicant: Intel Corporation, Santa Clara, CA (US)

(72) Inventors: Balaji Srinivasan, Folsom, CA (US); Daniel Chu, Folsom, CA (US); Lark-Hoon Leem, San Diego, CA (US); John Gorman, San Jose, CA (US); Mase Taub, Folsom, CA (US); Sandeep Guliani, Folsom, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/396,224

(22) Filed: Dec. 30, 2016

(51) Int. Cl.
*G11C 13/00* (2006.01)

(52) U.S. Cl.
CPC ...... *G11C 13/0033* (2013.01); *G11C 13/0004* (2013.01); *G11C 13/004* (2013.01); *G11C 13/0069* (2013.01)

(58) Field of Classification Search
CPC ............................ G11C 13/0069; G11C 7/222
USPC ............................................. 365/163, 189.05
See application file for complete search history.

(56) References Cited

U.S. PATENT DOCUMENTS

| 6,897,717 B1 * | 5/2005 | Eddleman ............... G05F 3/262 327/108 |
| 6,914,255 B2 | 7/2005 | Lowrey |
| 7,136,322 B2 * | 11/2006 | Brennan ................. G11C 17/16 365/201 |
| 7,983,065 B2 | 7/2011 | Samachisa |
| 8,934,280 B1 * | 1/2015 | Kuo .................... G11C 13/0069 365/145 |
| 9,224,492 B1 * | 12/2015 | Watanabe .............. G11C 29/14 |
| 9,437,293 B1 * | 9/2016 | Kripanidhi .......... G11C 13/0064 |
| 9,443,569 B2 * | 9/2016 | Cho ....................... G11C 5/147 |
| 9,601,193 B1 * | 3/2017 | Zeng .................. G11C 13/0028 |
| 2002/0027451 A1 * | 3/2002 | Shinozaki ............ G11C 7/1078 326/105 |
| 2004/0104712 A1 * | 6/2004 | Tanigawa ................ G05F 1/575 323/280 |
| 2005/0083747 A1 * | 4/2005 | Tang ...................... G11C 5/147 365/210.1 |

(Continued)

OTHER PUBLICATIONS

International Search Report and Written Opinion dated Jun. 8, 2016, issued in corresponding International Application No. PCT/US2016/017870, 10 pages.

(Continued)

*Primary Examiner* — Michael Tran
(74) *Attorney, Agent, or Firm* — Alliance IP, LLC

(57) ABSTRACT

In one embodiment, an apparatus comprises read circuitry to apply a read voltage to a three dimensional crosspoint (3DXP) memory cell; and write setback circuitry to apply a first setback pulse having a first magnitude to the 3DXP memory cell in response to the application of the read voltage, wherein applying the first setback pulse comprises bypassing a current mirror that is to limit or control a magnitude of a second setback pulse applied to the 3DXP memory cell when the current mirror is coupled to the 3DXP memory cell.

20 Claims, 9 Drawing Sheets

(56) References Cited

U.S. PATENT DOCUMENTS

| | | | |
|---|---|---|---|
| 2006/0098469 A1* | 5/2006 | Yang | G11C 5/063 |
| | | | 365/63 |
| 2007/0247196 A1 | 10/2007 | Niedermeier et al. | |
| 2008/0025079 A1 | 1/2008 | Philipp et al. | |
| 2008/0165570 A1 | 7/2008 | Happ et al. | |
| 2009/0323403 A1* | 12/2009 | Chen | G11C 11/1673 |
| | | | 365/158 |
| 2010/0149857 A1 | 6/2010 | Tang | |
| 2011/0134685 A1 | 6/2011 | Kau et al. | |
| 2012/0250440 A1* | 10/2012 | Wu | G11C 7/065 |
| | | | 365/203 |
| 2013/0070511 A1* | 3/2013 | Wells | G11C 8/06 |
| | | | 365/148 |
| 2013/0294136 A1* | 11/2013 | Siau | G11C 7/04 |
| | | | 365/66 |
| 2013/0301335 A1* | 11/2013 | Ong | G11C 29/06 |
| | | | 365/148 |
| 2014/0169089 A1* | 6/2014 | Castro | G11C 7/10 |
| | | | 365/163 |
| 2014/0254051 A1* | 9/2014 | Srivastava | G05F 1/10 |
| | | | 361/56 |
| 2015/0131369 A9* | 5/2015 | Abedifard | G11C 11/1677 |
| | | | 365/158 |
| 2015/0213886 A1* | 7/2015 | Toda | G11C 13/0011 |
| | | | 365/148 |
| 2015/0228351 A1* | 8/2015 | Wang | G11C 16/26 |
| | | | 365/185.21 |
| 2015/0262661 A1 | 9/2015 | Chu et al. | |
| 2016/0111167 A1* | 4/2016 | Pan | G11C 16/26 |
| | | | 365/185.11 |
| 2016/0118101 A1* | 4/2016 | Sanasi | G11C 11/1675 |
| | | | 365/158 |
| 2016/0284399 A1* | 9/2016 | Mantegazza | G11C 13/004 |
| 2017/0047376 A1* | 2/2017 | Kurotsuchi | H01L 27/105 |

OTHER PUBLICATIONS

U.S. Appl. No. 15/180,556, filed Jun. 13, 2016 entitled "Integrated Setback Read With Reduced Snapback Disturb".

* cited by examiner

100

900

METHOD AND APPARATUS FOR MULTI-LEVEL SETBACK READ FOR THREE DIMENSIONAL CROSSPOINT MEMORY

FIELD

The present disclosure relates in general to the field of computer development, and more specifically, to multi-level setback read for three dimensional crosspoint memory.

BACKGROUND

A computer system may include one or more central processing units (CPUs) which may communicate with one or more storage devices. A CPU may include a processor to execute an operating system and/or other software applications that utilize a storage device coupled to the CPU. The software applications may write data to and read data from the storage device.

A storage device may include a crosspoint memory technology such as multi-stack three dimensional crosspoint (3DXP) memory cells. Read disturb (or weak programming) of a cell during a read operation due to snapback discharge effect is a fundamental risk to memory cell devices. For example, a read operation may be performed to differentiate states of the cell. However, a first state of the cell may be disturbed or weakly programmed to a second state due to snapback discharge effect during read.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
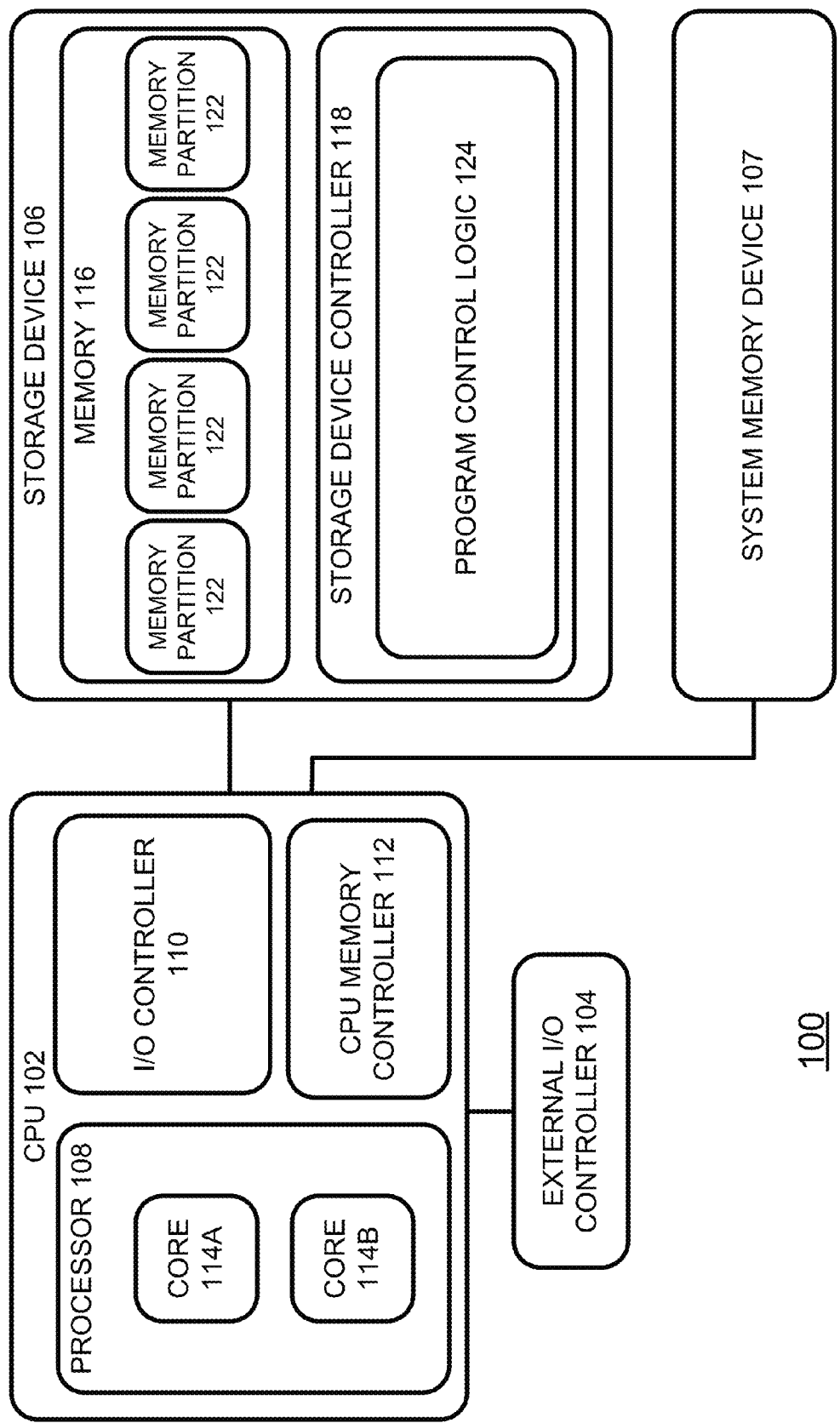
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, a storage device 106, and system memory device 107. During operation, data may be transferred between a storage device 106 or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a memory 116 comprising any suitable number of memory partitions 122.

A read operation for a 3DXP cell may be used to differentiate between the states of the cell. In one example, a demarcation bias voltage "VDM", is applied across the terminals of the 3DXP cell. In response to this bias being applied, the cell then goes into a conductive ON state (state1), or remains in a weakly conductive OFF state (state0). However, a cell in the first state may be weakly programmed or disturbed due to a snap-back discharge effect during the read operation.

Emerging solutions include mitigating read disturb by reducing cell capacitance during the read operation to limit current through the cell during the read to be short and therefore limit cell heating. However, in such a technique, an effective cell capacitance may define a sense margin resulting in a trade-off between read disturb and sense margin. Additionally, due to cell scaling to smaller dimensions, thermal latency is expected to scale, resulting in an increase of array capacitance due to the larger tiles required for the same array efficiency and due to cell pitch reduction. Another proposed solution includes additional circuitry to perform a short setback operation after the snapback discharge to mitigate the disturb effect. This setback pulse is shorter than a regular set pulse operation and is performed concurrently with the operation to sense data out of the cell.

Various embodiments of the present disclosure provide for a short setback operation including multi-rate setback control capability through the addition of simple switch circuitry and a logic control signal. Particular embodiments provide for multiple setback current rates to push a 3DXP cell back into the right state in conjunction with a read operation. Various embodiments may provide improved mitigation to read disturb due to the snapback discharge effect when compared with prior solutions.

CPU 102 comprises a processor 108, such as a microprocessor, an embedded processor, a DSP, a network processor, a handheld processor, an application processor, a co-processor, an SOC, or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that maintains its state even after power to the system memory device 107 is removed. A system memory device 107 may be dedicated to a particular CPU 102 or shared with other devices (e.g., one or more other processors or other device) of computer system 100.

In various embodiments, a system memory device 107 may include a memory comprising any number of memory partitions, a memory device controller, and other supporting logic (not shown). A memory module may include non-volatile memory and/or volatile memory. Non-volatile memory is a storage medium that does not require power to maintain the state of data stored by the medium. Nonlimiting examples of nonvolatile memory may include any or a combination of: planar or 3D NAND flash memory or NOR flash memory, 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), resistive RAM, other various types of non-volatile random access memories (RAMs), and/or magnetic storage memory. Volatile memory is a storage medium that requires power to maintain the state of data stored by the medium. Nonlimiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and a memory 116 comprising four memory partitions 122 operable to store data, however, a storage device may include any suitable number of memory partitions. A memory partition 122 includes a plurality of memory cells that are each operable to store one or more bits. The cells of a memory partition 122 may be arranged in any suitable fashion, such as in rows (e.g., wordlines) and columns (e.g., bitlines), three dimensional structures, sectors, or other manner. In various embodiments, the cells may be logically grouped into banks, blocks, subblocks, wordlines, pages, frames, bytes, or other suitable groups. In various embodiments, a memory partition 122 may include any of the volatile or non-volatile memories listed above or other suitable memory. In a particular embodiment, each memory partition 122 comprises one or more 3DXP memory arrays. 3DXP arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device. In particular embodiments, memory partitions 122 each include non-volatile memory.

In a particular embodiment, a memory 116 is a semiconductor package. In various embodiments, a semiconductor package may comprise a casing comprising one or more semiconductor dies (also referred to as chips). A package may also comprise contact pins or leads used to connect to external circuits. In a particular embodiment, each memory partition 122 is embodied on its own die. Accordingly, in some embodiments, a memory 116 may be a package that includes a plurality of dies that each include a memory partition 122. However, a package is merely one example of a form a memory 116 may take as a memory device may be any suitable arrangement of one or more memory modules and associated logic in any suitable physical arrangement. For example, although a single physical package may include a single memory 116, multiple memories 116 could be resident on a single package or a memory 116 could be spread across multiple packages. As another example, a memory 116 may be embodied in one or more different physical mediums, such as a circuit board, die, disk drive, other medium, or any combination of thereof (or combination with one or more packages). In other embodiments, a single die may include multiple memory partitions 122 (e.g., all or a portion of the memory partitions 122 of the memory 116). As another example, a memory partition 122 may be embodied in one or more different physical mediums, such as a circuit board, package, disk drive, other medium, or any combination thereof (or in combination with one or more dies).

Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to memory 116, and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as memory 116 or on a different circuit board, or device. For example, in some environments, storage device controller 118 may be a centralized storage controller that manages memory operations for multiple different memory 116 (which could each be of the same type of memory or could be of different types) of computer system 100 (and thus could provide storage device controller functionality described herein to any of the memories to which it is coupled).

In various embodiments, the storage device 106 also includes program control logic 124 which is operable to control the programming sequence performed when data is written to or read from memory 116. In various embodiments, program control logic 124 may provide the various voltages (or information indicating which voltages should be provided) that are applied to memory cells during the programming and/or reading of data (or perform other operations initiating data reads or writes), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as memory 116.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
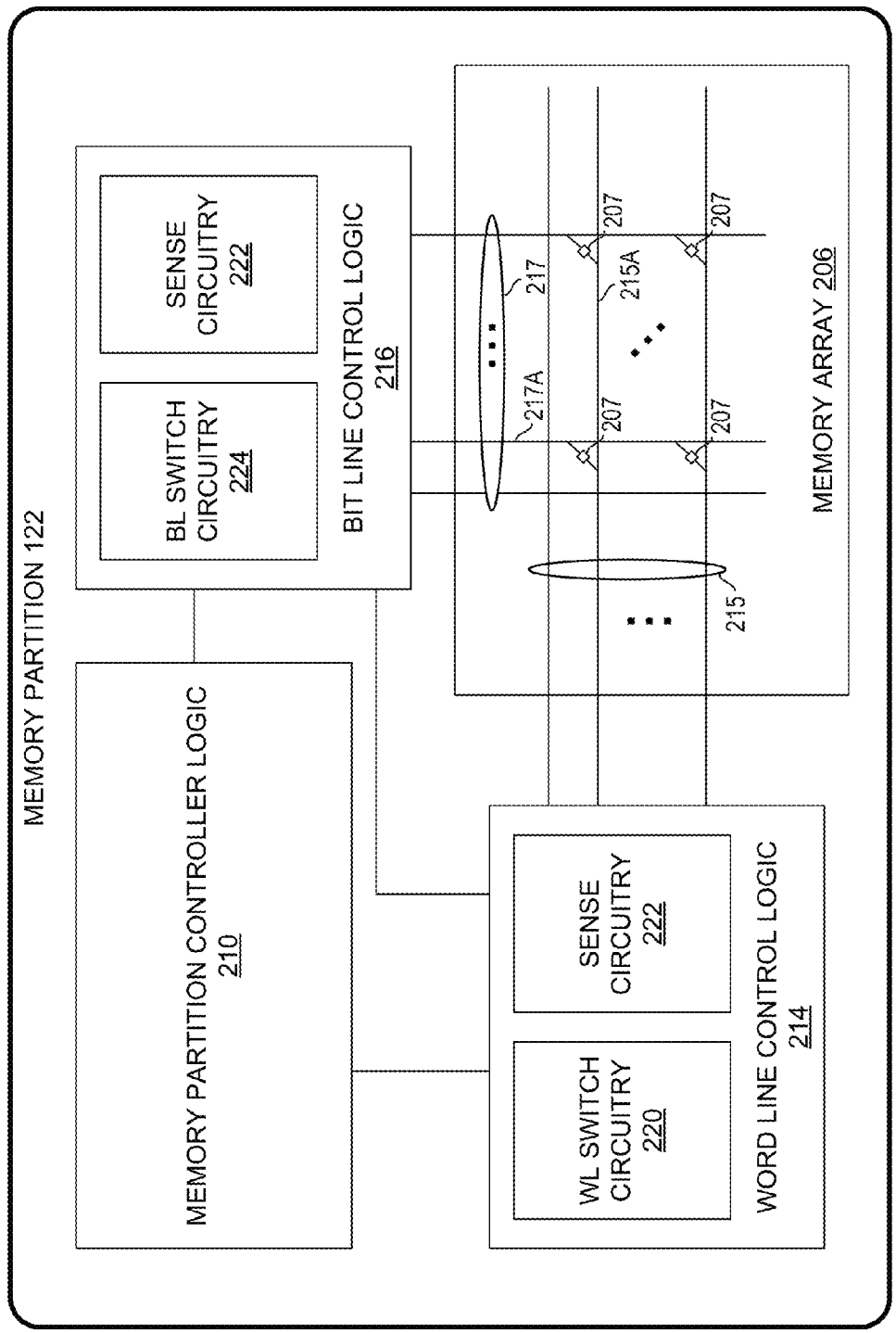
FIG. 2 illustrates an example memory partition in accordance with certain embodiments.

FIG. 2 illustrates an example memory partition 122 in accordance with certain embodiments. In one embodiment, a memory partition 122 may include 3DXP memory which may include phase change memory (PCM), resistive RAM, or other suitable memory types. Phase change memory typically uses a chalcogenide material for the memory elements. A memory element is the unit that actually stores information. In operation, phase change memory may store information on the memory element by changing the phase of the memory element between amorphous and crystalline phases. The chalcogenide material may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell (e.g., a PCM cell) that also includes a selector, i.e., a select device coupled to the memory element. The select devices are configured to facilitate combining a plurality of memory elements into an array.

In some embodiments, 3DXP memory array may comprise a transistor-less (i.e., at least with respect to the data storage elements of the memory) stackable crosspoint architecture in which memory cells sit at the intersection of row address lines and column address lines arranged in a grid. The row address lines and column address lines, called word lines (WLs) and bit lines (BLs), respectively, cross in the formation of the grid and each memory cell is coupled between a WL and a BL where the WL and BL cross (i.e., crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line located above the word line. It should be noted that row and column are terms of convenience used to provide a qualitative description of the arrangement of WLs and BLs in crosspoint memory. In various embodiments, the cells of the 3DXP memory array may be individually addressable. In some embodiments, bit storage may be based on a change in bulk resistance of a 3DXP memory cell. In various embodiments, 3DXP memory may include any of the characteristics of 3D)(Point memory manufactured by INTEL CORPORATION and/or MICRON TECHNOLOGY, INC.

During a programming operation (i.e., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a first time period sufficient to cause the memory element to "snap back" and then maintained for a second time period to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the WL and a second bias voltage to the BL that cross at the target memory cell for a time interval. A resulting differential bias voltage across the memory element is configured to be greater than a maximum set voltage and less than a minimum reset voltage for the memory element. In response, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

In the embodiment of FIG. 2, a memory partition 122 includes memory partition controller logic 210, word line control logic 214, bit line control logic 216, and memory array 206. A host device (e.g., CPU 102) may provide read and/or write requests including memory address(es) and/or associated data to memory partition 122 (via storage device controller 118) and may receive read data from memory partition 122 (via the storage device controller 118). Memory partition controller logic 210 (in conjunction with word line control logic 214 and bit line control logic 216) is configured to perform memory access operations, e.g., reading a target memory cell and/or writing to a target memory cell.

Memory array 206 corresponds to at least a portion of a 3DXP memory (e.g., that may include PCM cells or other suitable memory cells) and includes a plurality of word lines 215, a plurality of bit lines 217 and a plurality of memory cells, e.g., memory cell 207. Each memory cell is coupled between a word line ("WL") and a bit line ("BL") at a crosspoint of the WL and the BL. Each memory cell includes a memory element configured to store information and may include a memory cell select device (i.e., selector) coupled to the memory element. Select devices may include ovonic threshold switches, diodes, bipolar junction transistors, field-effect transistors, etc. Memory array 206 is configured to store binary data and may be written to (i.e., programmed) or read from.

Memory partition controller logic 210 may manage communications with storage device controller 118. In a particular embodiment, memory partition controller logic 210 may analyze one or more signals received from the storage device controller 118 to determine whether a command sent via a bus is to be consumed by the memory partition 122. For example, logic 210 may analyze an address of the command and/or the value on an enable signal line coupled to the storage device controller 118. Logic 210 may be configured to identify one or more target WLs associated with a received memory address (this memory address may be a separate address from the memory partition address that identifies the memory partition 122, although a portion of an address field of a command may identify the memory partition while another portion of the address field may identify one or more WLs). Memory partition controller logic 210 may be configured to manage operations of WL control logic 214 and BL control logic 216 based, at least in part, on the target WL identifiers.

WL control logic 214 includes WL switch circuitry 220 and sense circuitry 222. WL control logic 214 is configured to receive target WL address(es) from memory partition controller logic 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to WL select bias voltage to select the respective WL 215A. For example, switch circuitry 220 may include a plurality of transistors.

BL control logic 216 includes BL switch circuitry 224. In some embodiments, BL control logic 216 may include sense circuitry, e.g., sense circuitry 222. BL control logic 216 is configured to select one or more BLs for reading and/or writing operations. BL control logic 216 may be configured to select a target BL by coupling a BL select bias voltage (VPP) to the target BL. For example, VPP may have a value of 5.0 volts. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect presence or absence of a snap back event during a sense interval, e.g., during a read operation. Sense circuitry 222 is configured to provide a logic level output related to the result of the read operation to, e.g., memory partition controller logic 210. For example, a logic level corresponding to a logic one may be output if a snap back is detected and a logic level corresponding to a logic zero may be output if a snap back is not detected.

For example, in response to a signal from memory partition controller logic 210, WL control logic 214 and BL control logic 216 may be configured to select a target memory cell, e.g. memory cell 207, for a read operation by coupling WL 215A to WL select bias voltage and BL 217A to BL select bias voltage. One or both of sense circuitries 222 may then be configured to monitor WL 215A and/or BL 217A for a sensing interval in order to determine whether or not a snap back event occurs. If a sense circuitry 222 detects a snap back event, then memory cell 207 may be in the set state. If a sense circuitry 222 does not detect a snap back event in the sensing interval, then memory cell 207 may be in the reset state.

Thus, WL control logic 214 and/or BL control logic 216 may be configured to select a target memory cell for a read operation, initiate the read operation, monitor the selected memory cell for a snap back event in a sensing interval and provide the result of the sensing to, e.g., memory partition controller logic 210.

In a particular embodiment, the sense circuitry 222 may include a word-line load connected to a word-line electrode to convert a current on the word-line electrode to a voltage that is a first input to a voltage comparator (i.e., sense amp) of the sense circuitry. An equivalent word-line load may be connected to a reference current to provide a voltage that is a second input to the voltage comparator. When a particular word-line and bit-line are selected in the array, the word-line load on the word-line electrode may convert the current on the selected bit-line to a voltage. In some embodiments, leakage components of the current can be mitigated by respectively selecting a bias for all other unselected word-lines and bit-lines that reduces or minimizes leakage. Capacitive components of the current can be mitigated by allowing sufficient time for the capacitive components to dissipate. The current that is converted to the first input to the voltage comparator may correspond with the current of the target memory cell. The reference current may be selected such that the current of the target memory cell is lower than the reference current before snapback of the target memory cell and higher than the reference current after snapback of the target memory cell. In this manner, an output of the voltage comparator may be indicative of a state of the target memory cell. A latch may be coupled to the output of the voltage comparator to store the output of the read operation.

Figure 3:
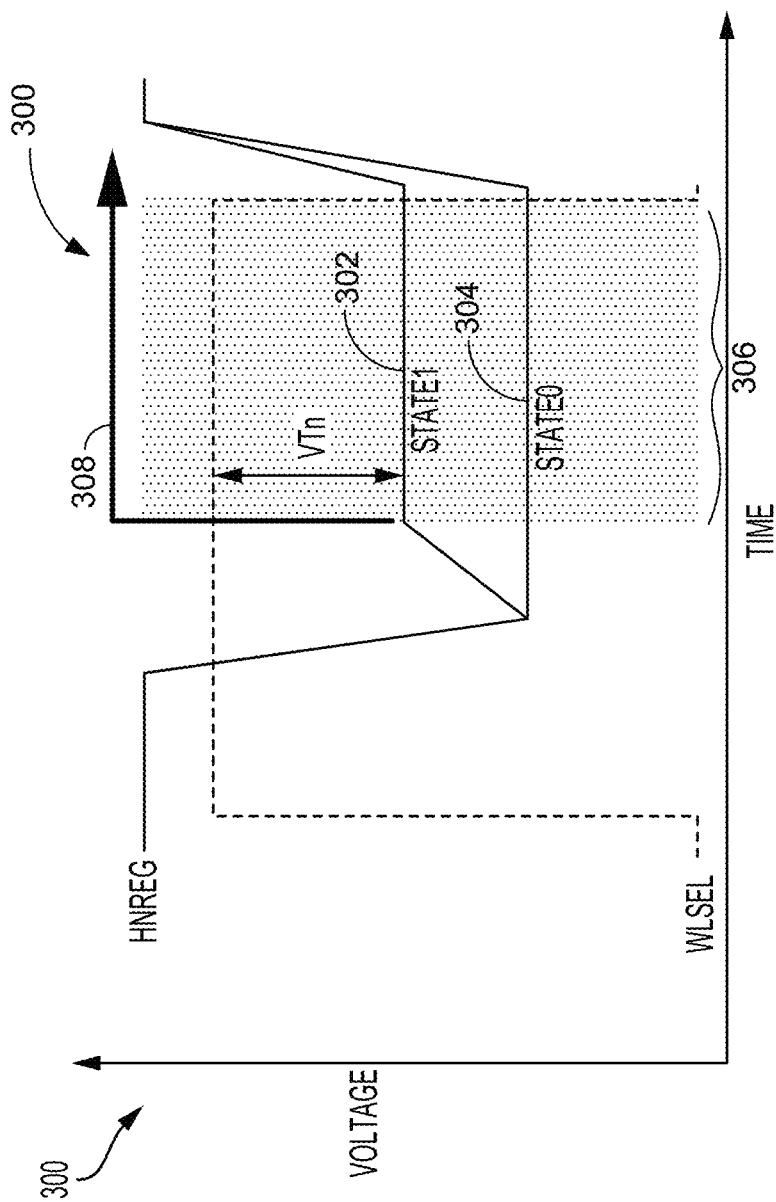
FIG. 3 illustrates a graph depicting voltage profile and timing for various nodes of a memory array during a read operation, in accordance with certain embodiments.

FIG. 3 illustrates a graph 300 depicting voltage profile and timing for various nodes of a memory array during a read operation, in accordance with some embodiments. During a read operation, a word line select (WLSEL) node (e.g., the WLSEL node of FIGS. 5-8) may be biased with a voltage to turn on a transistor (e.g., transistor 504 of FIGS. 5-8) and build up a voltage bias across the 3DXP cell (e.g., 3DXP cell 502 of FIGS. 5-8). A voltage of HNREG node (e.g., HNREG node of FIGS. 5-8) may drop initially and then rise when the 3DXP cell turns on ("snapped") if the 3DXP cell is in a crystalline state, as can be seen at 302. A voltage of the WL (i.e., V(WL)) at the cell may also go down and otherwise follow the HNREG and a voltage of the BL (i.e., V(BL)) at the cell may be pulled up such that V(BL)-V(WL) is equal to a total bias on the 3DXP cell, which may be a demarcation read voltage (VDM) that is applied during the read operation. However, if the 3DXP cell is in an amorphous state, the voltage of the HNREG node may stay low until the HNREG node is in an off state and the voltage rises again to an initial voltage, as can be seen at 304. In some embodiments, an applied bias such as the VDM of a read pulse may be high enough to only turn on 3DXP cells in the crystalline state, which may have a lower threshold voltage (Vt) than 3DXP cells in the amorphous state. In some embodiments, the VDM may be supplied through negative and/or positive regulated nodes. For example, the bit-line electrode of the 3DXP cell may be a positive regulated node and the word-line electrode coupled to the cell (which may function as HNREG node, in some embodiments) may supply the bias for VDM.

Sense may be performed when the 3DXP cell in the crystalline state turns on at 302 (e.g., in the shaded region 306 or during the time indicated by arrow 308) before the 3DXP cell turns off, which may make latency independent of cell shutoff. Sensing may be performed to determine whether the 3DXP cell is in the crystalline state (e.g., at 302) or the amorphous state (e.g., at 304). Sense circuitry may determine whether the 3DXP cell is in the crystalline state or the amorphous state based on a measured voltage of the HNREG node. A sense margin may be substantially fixed irrespective of background leakage, which may increase in robustness of the read operation and prevent erroneous detection of state 0 bits being read as state 1. For example, the sense margin may be determined by a threshold voltage of a WLSEL NMOS transistor (e.g., transistor 504 of FIGS. 5-8). Voltage VTn may represent a difference between the WLSEL node and the HNREG node when the 3DXP cell in the crystalline state turns on at 302 (e.g., in the shaded region 306). That is, in some embodiments, a voltage of the HNREG node may correspond with a voltage of the WLSEL node minus the voltage VTn. In some embodiments, a voltage of the HNREG node when the 3DXP cell is in the amorphous state may correspond with a voltage of a WLVDM node. In a particular embodiment, the voltage of the WLVDM node may be a negative bias voltage applied to the WL through a negative regulator. In one embodiment, WLVDM may have a nominal capacity of −3.6 Volts.

As described earlier, during a read operation, a suitable voltage bias may be applied across the target cell to build a demarcation voltage (VDM). This may result in a snapback event across the cell if the snapback voltage (Vth) of the target cell is less than VDM and result in a transfer of charge between the BL and WL through the cell. Depending on the conditions, this snapback discharge event may be accompanied by a read disturb occurrence. For example, the cell may be weakly programmed or disturbed due to the snap-back discharge effect during the read operation. Various embodiments of the present disclosure provide a multi-rate short setback read operation that allows for application of a multi-level setback current to the cell to mitigate the read disturb effects (i.e., to cause the cell to move back to the correct snapback voltage).

Figure 4:
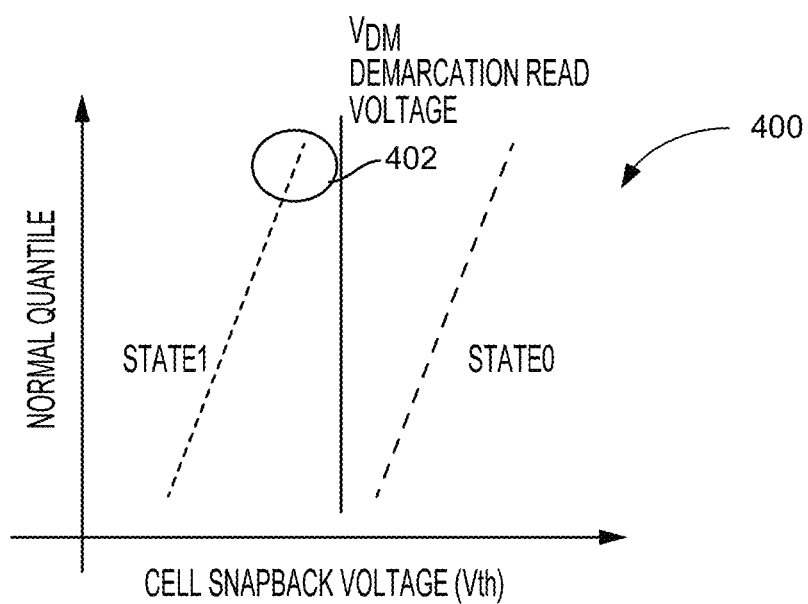
FIG. 4 illustrates a graph depicting an example distribution of three dimensional crosspoint (3DXP) cell snapback voltages in accordance with certain embodiments.

FIG. 4 illustrates a graph depicting an example distribution of 3DXP cell snapback voltages in accordance with certain embodiments. An example normal quantile of 3DXP cells is depicted on the vertical axis and cell snapback voltage (Vth) is depicted on the horizontal axis. The demarcation read voltage VDM is shown to distinguish 3DXP cells in a crystalline state (State1) from cells in an amorphous state (State0).

Graph 400 shows a case where there is a clear delineation at VDM for 3DXP cells in the crystalline state (State1) and the amorphous state (State0). The 3DXP cells 402 at an upper end of the distribution in the crystalline state are properly read as being in the crystalline state (State1). In some cases, the 3DXP cells 402 at the upper end of the distribution in the crystalline state (e.g., 3DXP cells 402) may be disturbed above the VDM after a read disturb event, and will be erroneously set to the amorphous state (State0).

In various embodiments, in order to correct for read disturb effects, a setback pulse (e.g., shorter write pulse) may be applied to the 3DXP cell when the 3DXP cell in the crystalline state turns on at 302 (e.g., in the shaded region 306). For example, a controlled low current may be applied to the 3DXP cell to help set it back. In various embodiments, the magnitude of the current is selectable from multiple levels of setback current. The setback pulse may be turned off when the voltage of the WLSEL node goes back down. In some embodiments, 3DXP cells in the crystalline state may not turn on during the read pulse (e.g., applied bias VDM) and, thus, may not receive the setback pulse.

Figure 5:
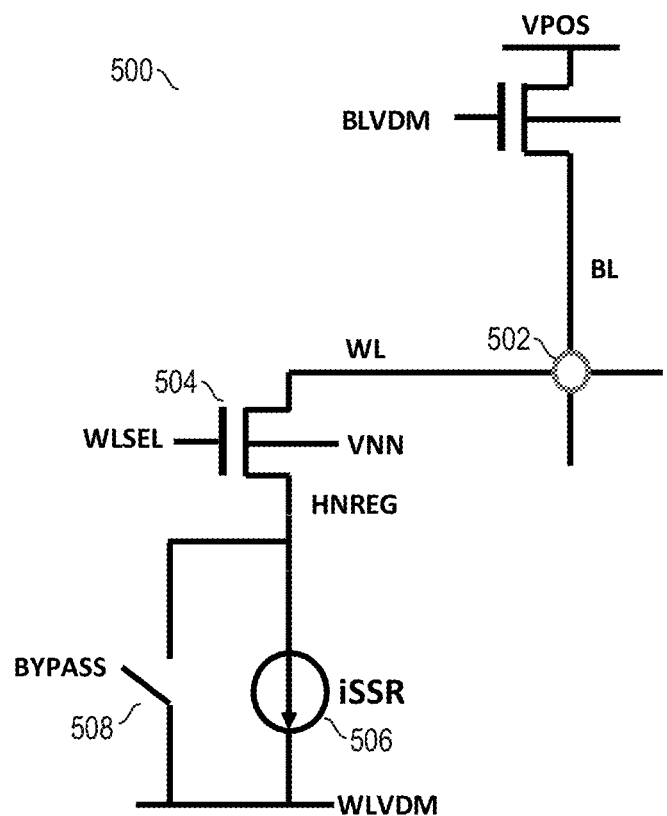
FIG. 5 illustrates example circuitry associated with a 3DXP cell of a device in accordance with certain embodiments.
Figure 5:
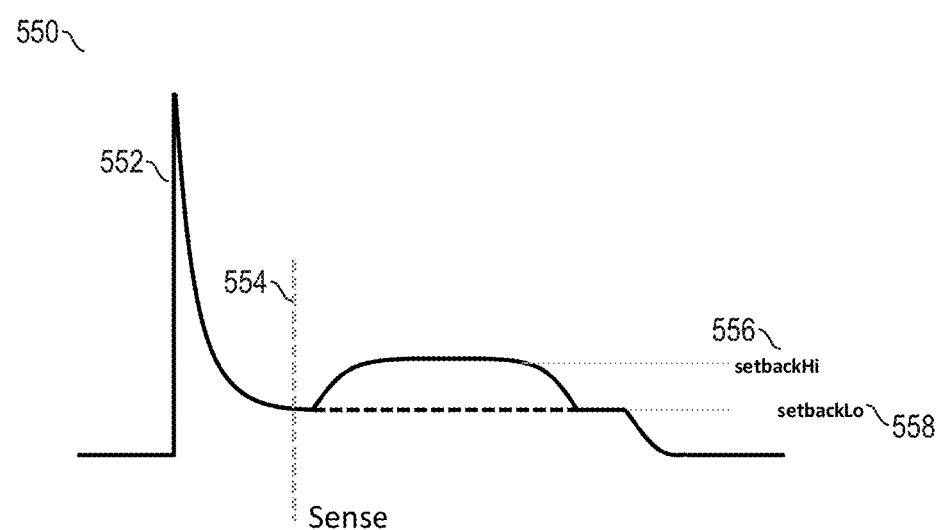

FIG. 5 schematically illustrates example circuitry 500 associated with a 3DXP cell 502 of a 3DXP device, in accordance with some embodiments. The 3DXP cell 502 may have any suitable characteristics of the 3DXP cell 107 described above. In various embodiments the 3DXP cell 502 may comprise a PCM cell, a resistive RAM cell, or other suitable memory cell compatible with the 3DXP architecture. In a particular embodiment, 3DXP cell 502 includes a phase change material and a cell selector such as an ovonic threshold switch (OTS) coupled with a word-line (WL) node and a bit-line (BL) node, as depicted in FIG. 5.

According to some embodiments, one or more transistors and/or capacitors may be coupled with the WL node. For example, in the depicted embodiment, as can be seen, transistor 504 may be coupled with the WL node. A negative regulated supply node (HNREG node) may be coupled with the transistor 504. The HNREG node may be used as a sense node in some embodiments. For example, the HNREG node may be used as an input for a sense amp comparator.

In various embodiments, the 3DXP cell may be coupled to current limiting circuitry 506. The current limiting circuitry 506 may provide or control (e.g., limit) a first level of a setback current through the 3DXP cell during a setback operation. In an embodiment, the current-limiting circuitry 506 comprises a current mirror circuit. The current-limiting circuitry 506 may comprise a transistor gate that is configured to limit a current of the word-line electrode to a maximum current level. For example, the transistor may be an n-type transistor having a gate that is controlled to an analog level such that the transistor delivers up to a maximum desired current. The current-limiting circuitry 506 may be enabled by applying a gate voltage to the transistor.

In various embodiments, the current provided by the current-limiting circuitry 506 may not be the optimal setback current for all cells. In the embodiment depicted, the current-limiting circuitry 506 may be bypassed using bypass switch 508. In a particular embodiment, bypass switch 508 is implemented as an NMOS transistor with a logic level control signal. By bypassing the current-limiting circuitry 506 during setback, a second level of setback current through the 3DXP cell during a setback operation may be applied. Closing the switch 508 results in the grounding of the HNREG node to WLVDM, taking the current-limiting circuitry out of the signal path. When the switch is closed, the current is limited by the Vgs drop (the voltage at WLSEL minus the voltage at HNREG) across the select device (e.g., transistor 504). Accordingly, the higher current may be dynamically adjustable by varying the voltage applied to WLSEL (as this will change the Vgs drop) (e.g., an optimal voltage could be determined by test circuitry after fabrication during a tuning process).

Once the desired pulse width at the higher current (i.e., the growth current) is reached, the setback pulse may be turned off when the voltage of the WLSEL node goes back down. In some embodiments, the bypass operation ends (and the current-limiting circuitry is included in the path for a period of time) prior to the WLSEL node going back down, such that a non-abrupt stepdown from a high stepback current is achieved. This is evident in the following timing graphs.

Graph 550 depicts the current through the 3DXP cell 502 during a read with integrated setback. During a read operation with integrated setback, the WLSEL transistor 504 may control snap back discharge during a read pulse and the path through the switch 508 and/or current-limiting circuitry (e.g., 506) may provide/control current during the integrated setback pulse with a current configured to set the 3DXP cell back to the crystalline state. A measured voltage of the HNREG node may be fed into a sensing circuit, which may determine if the 3DXP cell was in crystalline or amorphous state (this result may be used to determine whether the setback pulse is to be applied).

Referring to the graph, the snapback event causes a spike 552 in the current through the 3DXP cell. The state of the 3DXP cell 502 is sensed at 554 and then a setback current is applied. Based on whether switch 508 is open or closed, a setbackHi current 556 (if the switch is closed) or a setbackLo current 558 (if the switch is open and the current-limiting circuitry is included in the path) may be applied for a period of time.

Figure 6:
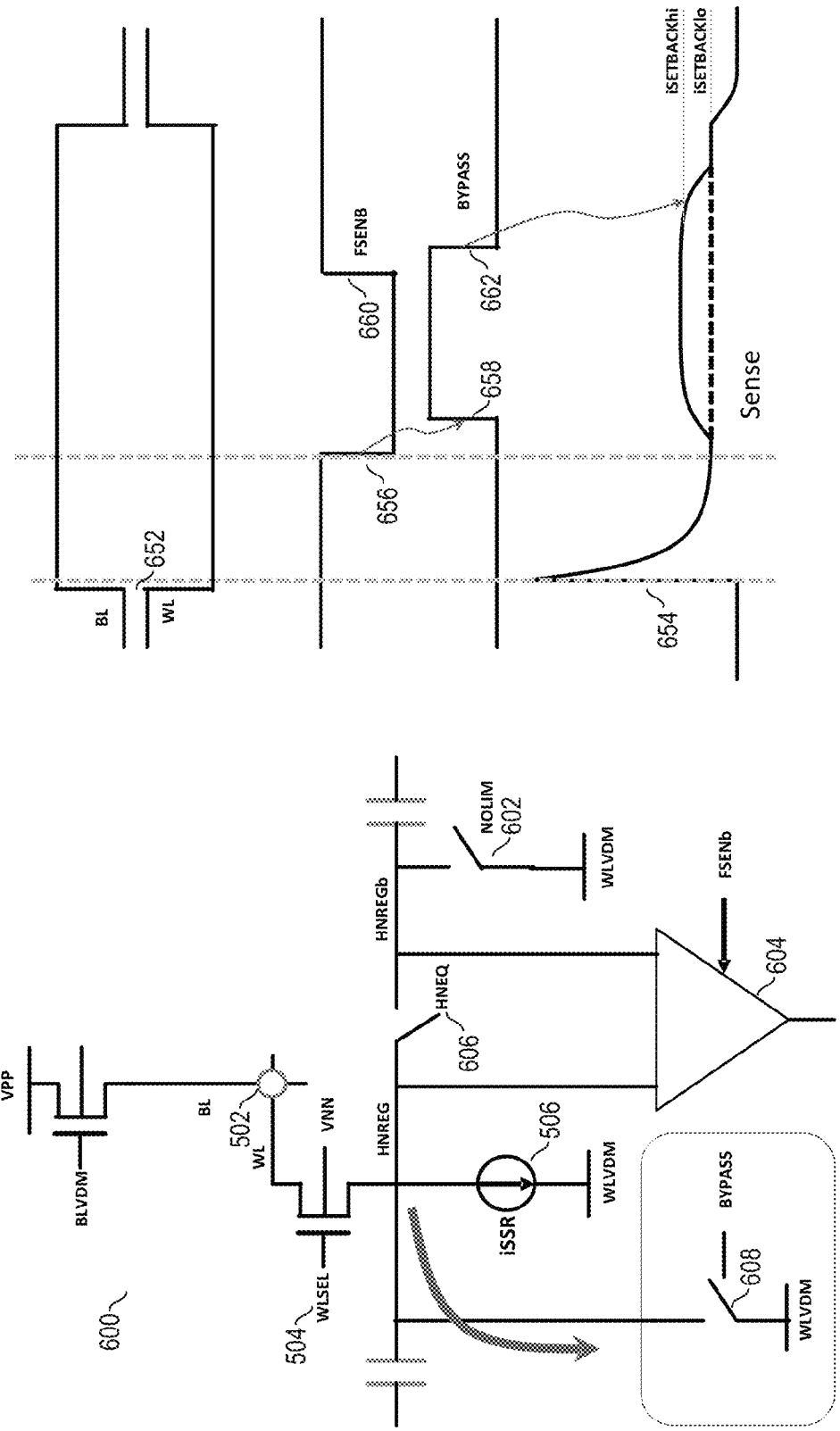
FIG. 6 illustrates example circuitry associated with a 3DXP cell of a device in accordance with certain embodiments.

FIG. 6 schematically illustrates example circuitry 600 associated with a 3DXP cell 502 of a device, in accordance with some embodiments. While many elements of FIG. 6 are similar to corresponding elements of FIG. 5, the circuitry 600 includes additional illustrative elements. For example, circuitry 600 includes sense amp 604 which is able to resolve the state of the 3DXP cell 502 during a read operation. As another example, circuitry 600 includes an equalization switch HNEQ 606, which is closed to force both inputs to the sense amp 604 to the same potential prior to sensing the state of the 3DXP cell 502 (at which time the switch would be open) and a NOLIM switch 602 used to build the reference voltage used by the sense amp 604. The various capacitances coupled to nodes HNREG and HNREGb are a lumped sum representation of parasitic capacitances present at those nodes. In addition, the bypassing of the current-limiting circuitry 506 is provided by a bypass switch 608. In various embodiments, circuitry 600 may include additional elements (i.e., some elements are omitted to simplify the circuit diagram). For example, in a particular embodiment, HNREGb may be coupled to a supply voltage Vss via one or more switches.

The circuitry 600 is able to provide a multi-level setback current similar to that provided by circuitry 500. The various diagrams of FIG. 6 depict the timing of various signals. When the read is performed, the bitline voltage is pulled high and the wordline voltage is pulled low at 652, effectively applying the DMV across the 3DXP cell 502. This causes snapback event 654 in a 3DXP cell in the crystalline phase. After a period of time, the sense amp 604 is enabled at 656. The bypass switch is closed at 658, allowing the setback current to rise to iSETBACKhi. The sense amp 604 is then disabled at 660 and the bypass switch is opened at 662. In an alternative embodiment, the bypass switch may remain open and the setback current limited to iSETBACKlow by the current-limiting circuitry 506 (e.g., if it is determined that the higher current provided by iSETBACKhi is unnecessary).

Figure 7:
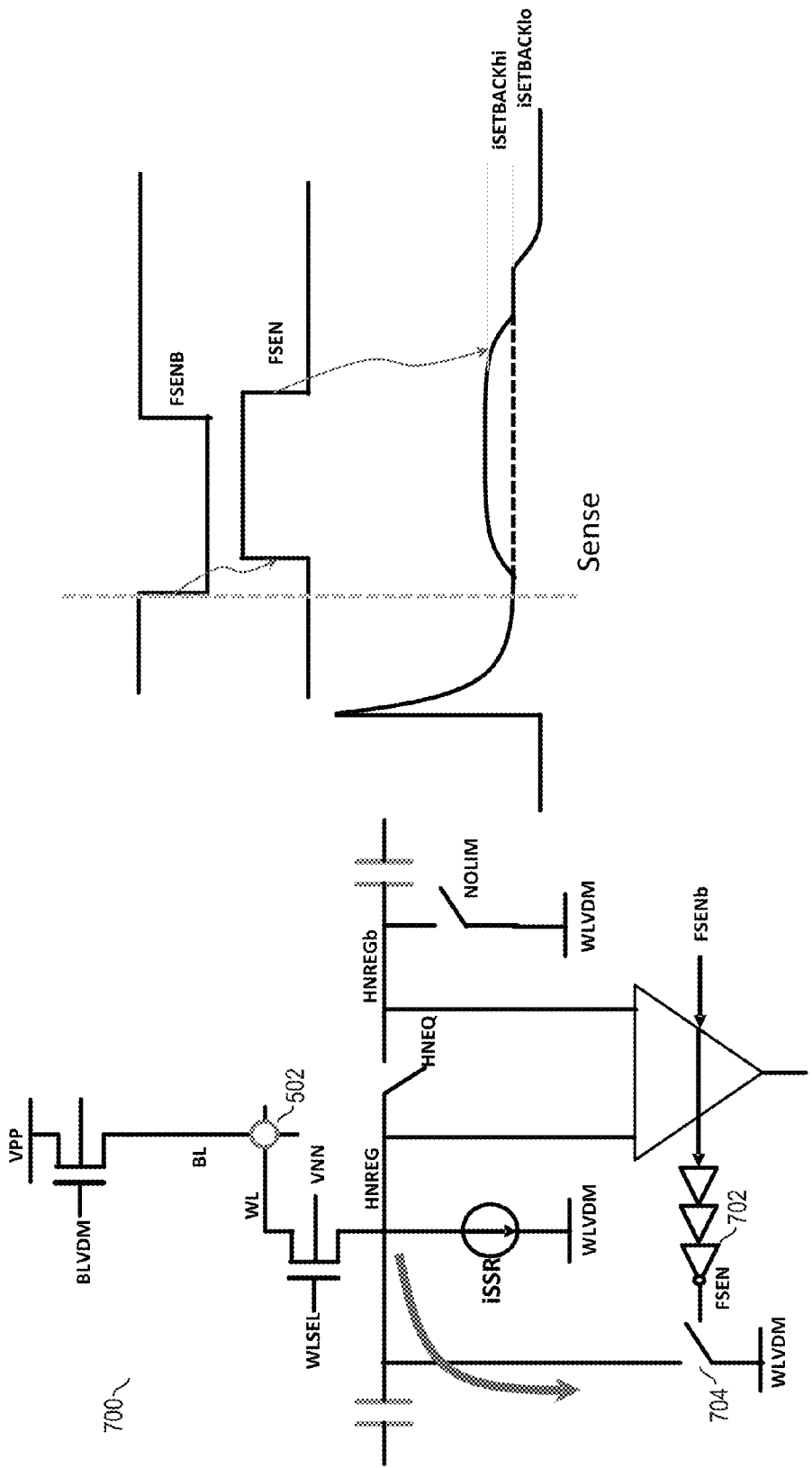
FIG. 7 illustrates example circuitry associated with a 3DXP cell of a device in accordance with certain embodiments.

FIG. 7 schematically illustrates example circuitry 700 associated with a 3DXP cell 502 of a 3DXP device, in accordance with some embodiments. Many of the elements of FIG. 7 are similar to the elements of FIG. 6. However, circuitry 700 includes delay buffers 702 coupled to the sense amp enable signal FSENb (although three delay buffers are shown in FIG. 7, various embodiments may utilize one or more delay buffers). The output of the delay buffers is used to control the bypass switch 704 (i.e., the output signal operates in a manner similar to the bypass signals in FIGS. 6 and 7). The buffers cause the sensing operation to be performed prior to the application of the iSETBACKhi current, as depicted in the timing diagrams of FIG. 7.

Figure 8:
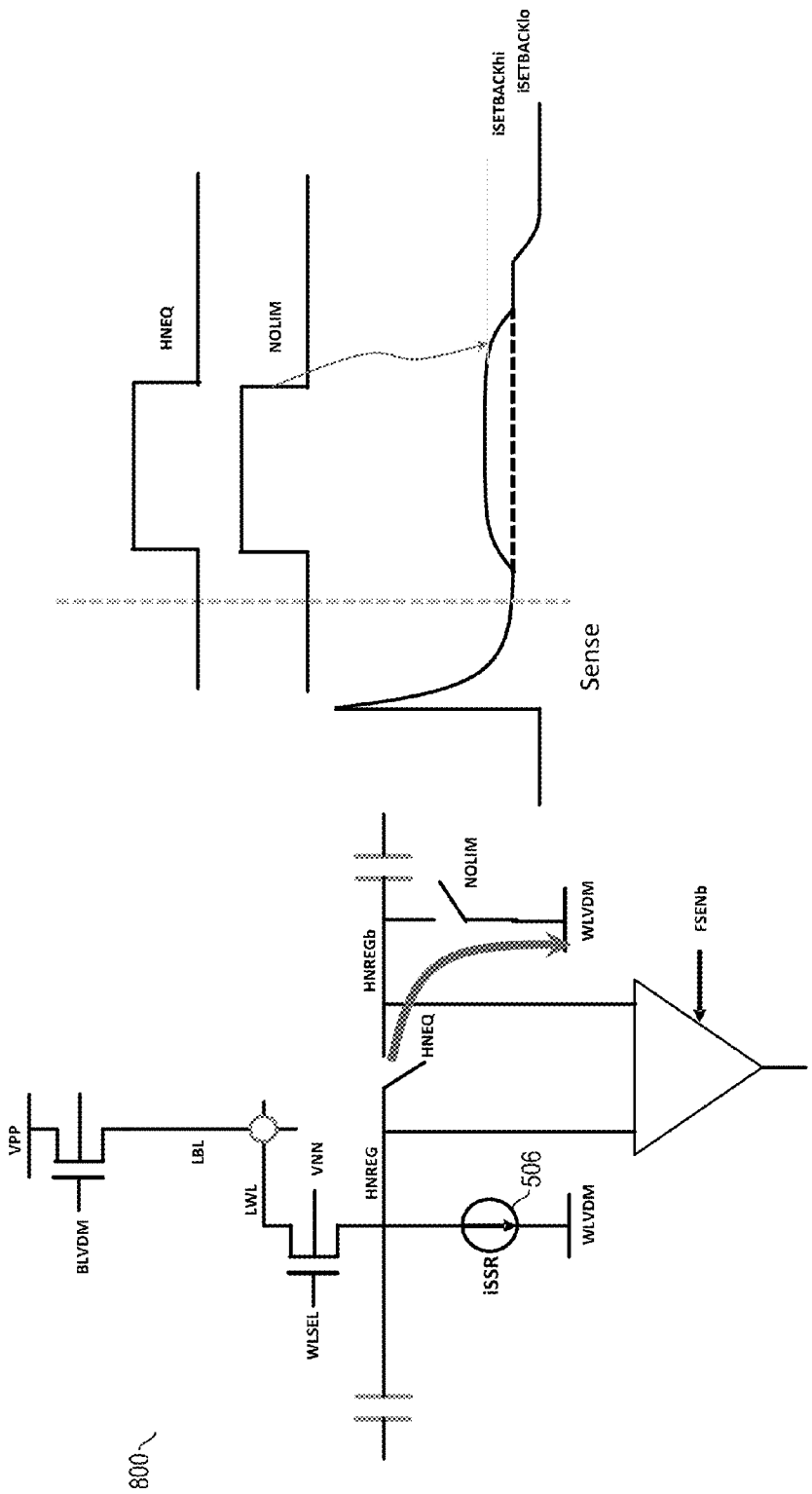
FIG. 8 illustrates example circuitry associated with a 3DXP cell of a device in accordance with certain embodiments.

FIG. 8 schematically illustrates example circuitry 800 associated with a 3DXP cell 502 of a device, in accordance with some embodiments. Many of the elements of FIG. 8 are similar to the elements of FIG. 6 and FIG. 7. However, circuitry 800 utilizes a different path for bypassing the current-limiting circuitry 506 during the setback operation. Specifically, circuitry 800 closes the switches HNEQ and NOLIM after the sensing operation has occurred (as indicated by the timing diagram) to couple HNREG to WLVDM and cause the setback current of iSETBACKhi.

Various embodiments may utilize any suitable length for the setback pulses. For example, the length of the setback pulse may be shorter than the length of the pulse used to set a 3DXP cell (e.g., from a 0 state to a 1 state). As one example, the setback pulse width may be less than ½0th of a regular write pulse. As another example, the setback pulse width may be less than $\frac{1}{100}^{th}$ of a regular write pulse.

Various embodiments may utilize any suitable magnitude for the setback pulses. Because the current through the path that bypasses the current-limiting circuitry (e.g., the current mirror) is adjustable (because it is limited by the Vgs drop across the select transistor), the voltage at the gate of the select transistor may be tuned for a particular wafer, die, or group of 3DXP cells to cause an optimal setback current (maximizing bit error rate). Similarly, in some embodiments, the current-limiting circuitry (e.g., 506) may be used (rather than bypassed) during setback for a particular group of 3DXP cells if the higher setback current is not needed.

Figure 9:
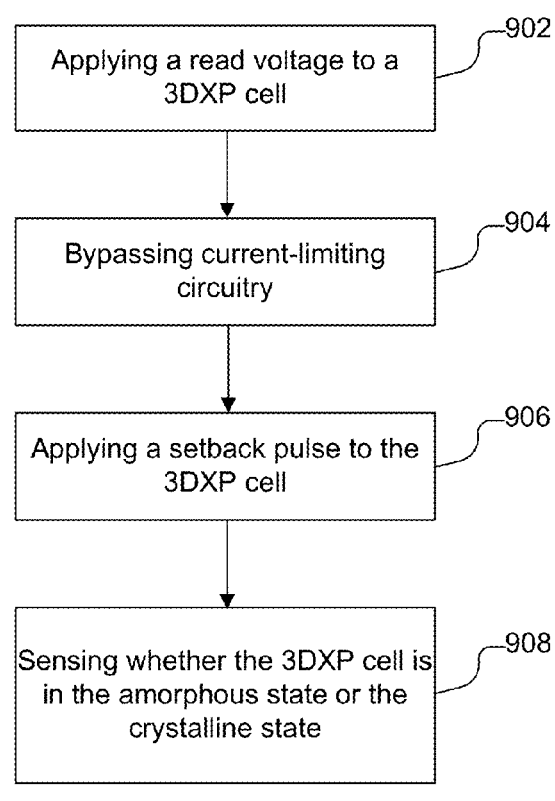
FIG. 9 illustrates a method for performing a short write pulse (e.g., a setback pulse) during a read operation to set back a 3DXP cell in accordance with certain embodiments.

FIG. 9 illustrates a method 900 for performing a short write pulse (e.g., a setback pulse) during a read operation to set back a 3DXP cell in accordance with certain embodiments. The method 900 may comport with embodiments described in connection with FIGS. 1-8 and vice versa.

At 902, the method 900 may include applying a read voltage to a 3DXP cell. Application of the read voltage may comport with embodiments described in connection with FIG. 3. For example, in some embodiments, a read operation may be performed by applying a read voltage (e.g., VDM) to the 3DXP cell. If the 3DXP cell is in the crystalline state, the read voltage will be enough to turn on the 3DXP cell (e.g., snap back will occur). If the 3DXP cell is in the amorphous state, the read voltage will not be enough to turn on the 3DXP cell and such 3DXP cell may not see or receive a setback pulse.

At 904, current-limiting circuitry (e.g., a current mirror) coupled to the 3DXP cell may be bypassed to enable a higher setback current than would be allowed by the current-limiting circuitry. At 906, the method 900 may include applying a setback pulse to the 3DXP cell based on the application of the read voltage, wherein the setback pulse is a shorter pulse performed for a first period of time that is shorter than a second period of time for a regular set pulse that is configured to transition the 3DXP cell from an amorphous state to a crystalline state. For example, a regular write pulse of a 3DXP cell may include a regular reset pulse to transition a 3DXP cell from a crystalline state (State 1) to an amorphous state (State0), which may be a relatively shorter pulse than a regular set pulse but with higher current to heat the 3DXP cell above its melting current and quench to amorphize the 3DXP cell, or a regular set pulse to transition a 3DXP cell from amorphous state (State0) to crystalline state (State1), which may be relatively longer pulse than the regular reset pulse but with lower current to allow the 3DXP cell time to crystallize. The setback pulse may be a shorter version of the regular set pulse to setback the 3DXP cell (e.g., erase unwanted programming caused by the snapback discharge, which is a short high current event that may disturb the 3DXP cell from a crystalline state).

In some embodiments, the first period of time may be $\frac{1}{100}$th of the second period of time or greater. The first period of time may be longer or shorter than $\frac{1}{100}$th of the second period according to various embodiments. In some embodiments, the first period of time may be $\frac{1}{20}$th of the second period of time or less in order to increase setback time and, accordingly, reduce disturb of 3DXP cells in the amorphous state (State0).

According to some embodiments, the setback pulse may be performed during the read operation. For example, the setback pulse may be applied during application of the read voltage to turn on the 3DXP cell. In some embodiments, the setback pulse may be applied in response to the 3DXP cell turning on based on application of the read voltage. The setback pulse may be applied subsequent to the 3DXP cell turning on in response to application of the read voltage and prior to the 3DXP cell turning off. In some embodiments, the setback pulse may be automatically applied to all 3DXP cells that threshold (snap) during application of the read pulse (e.g., 3DXP cells having a threshold voltage that is less than VDM, in the crystalline state). In some embodiments, the setback pulse may be applied during the entire period of time corresponding with the shaded region 306 depicted in FIG. 3.

At 908, the method 900 may include sensing, concurrently with application of the setback pulse, whether the 3DXP cell is in the amorphous state or the crystalline state. In some embodiments, sensing may be part of performing the read operation. In some embodiments, sensing may be performed subsequent to the 3DXP cell turning on in response to application of the read voltage and prior to the 3DXP cell turning off. For example, the 3DXP cell may turn on at the beginning of the shaded portion 306 and turn off at the end of the shaded portion 306 of FIG. 3. Sensing may be performed by sensing the HNREG node. In some embodiments, sensing may include sensing a voltage of the HNREG node by an amplifier to detect whether a target 3DXP cell is in crystalline or amorphous state.

Integrating a short write pulse (setback pulse) into the read pulse may have a variety of benefits. The setback pulse may write back the data of the 3DXP to state1 (crystalline state) while reducing a current spike due to snapback discharge by isolating a majority of circuit capacitance, which may otherwise exacerbate the current spike and cause more disturb. The scheme of integrating the setback pulse into the read pulse may set back a 3DXP cell that is partially programmed by a discharge spike. The sensing may be performed during the read pulse to reduce latency of the read operation as opposed to performing sensing after termination of the read pulse. A slow ramp down quench of the integrated setback read may allow reduction of a pulsewidth of the setback pulse to further reduce latency. Read latency may be further reduced by transferring the data out of the 3DXP cell as soon as the 3DXP cell thresholds while concurrently applying the setback pulse.

The flow described in FIG. 9 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 9 may be repeated, combined, modified or deleted where appropriate. Additionally, operations may be performed in any suitable order without departing from the scope of particular embodiments. As one example, in order to reduce latency impact, the sensing of whether the cell is in the amorphous or crystalline state may be performed after applying the read voltage (e.g., VDM bias) to the 3DXP cell and before bypassing the current-limiting circuitry. In various embodiments, operations may be performed concurrently.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory 116, storage device controller 118, memory partition 122, program control logic 124, memory partition controller logic 210, word line control logic 214, bit line control logic 216, read circuitry, write setback circuitry, sense circuitry, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprises read circuitry to apply a read voltage to a three dimensional crosspoint (3DXP) memory cell; and write setback circuitry to apply a first setback pulse having a first magnitude to the 3DXP memory cell in response to the application of the read voltage, wherein applying the first setback pulse comprises bypassing a current mirror that is to limit or control a magnitude of a second setback pulse applied to the 3DXP memory cell when the current mirror is coupled to the 3DXP memory cell.

In an embodiment, the write setback circuitry is to apply the first setback pulse by coupling a bias voltage to the 3DXP memory cell via a first switch coupled in parallel with the current mirror. In an embodiment, the first switch is enabled by a delayed signal derived from an enable signal coupled to a sense amp of the sense circuitry. In an embodiment, the write setback circuitry is to apply the first setback pulse by coupling a bias voltage to the 3DXP memory cell via a first switch coupled between two inputs of a sense amp of the sense circuitry and a second switch coupling the first switch to the bias voltage. In an embodiment, the first magnitude of the first setback pulse is larger than the second magnitude. In an embodiment, the first magnitude of the first setback pulse scales with a voltage of a wordline select signal applied to a transistor that couples a wordline to the 3DXP memory cell. In an embodiment, during a setback operation the first setback pulse is applied to the 3DXP memory cell for a first period of time and the second setback pulse is applied to the 3DXP memory cell for a second period of time that is shorter than the first period of time. In an embodiment, the setback circuitry is configured to apply the first setback pulse to the 3DXP memory cell upon a determination that the 3DXP memory cell turned on in response to application of the read voltage. In an embodiment, the 3DXP memory cell is in the crystalline state prior to the application of the read voltage and wherein the setback circuitry is to apply the first setback pulse subsequent to or simultaneously with the 3DXP memory cell turning on in response to application of the read voltage and prior to the 3DXP memory cell turning off In an embodiment, the sense circuitry is further to sense, concurrently with application of the first setback pulse, whether the 3DXP memory cell is in the amorphous state or the crystalline state.

In at least one embodiment, a method comprises applying a read voltage to a three dimensional crosspoint (3DXP) memory cell; and applying a first setback pulse having a first magnitude to the 3DXP memory cell in response to the application of the read voltage, wherein applying the first setback pulse comprises bypassing a current mirror that is to limit or control a magnitude of a second setback pulse applied to the 3DXP memory cell when the current mirror is coupled to the 3DXP memory cell.

In an embodiment, the first setback pulse is applied by coupling a bias voltage to the 3DXP memory cell via a first switch coupled in parallel with the current mirror. In an embodiment, the first switch is enabled by a delayed signal derived from an enable signal coupled to a sense amp that is to sense whether the 3DXP memory cell is in an amorphous state or a crystalline state. In an embodiment, the first setback pulse is to be applied by coupling a bias voltage to the 3DXP memory cell via a first switch coupled between two inputs of a sense amp and a second switch coupling the first switch to the bias voltage. In an embodiment, the first magnitude of the first setback pulse is larger than the second magnitude. In an embodiment, the first magnitude of the first setback pulse scales with a voltage of a wordline select signal applied to a transistor that couples a wordline to the 3DXP memory cell. In an embodiment, during a setback operation the first setback pulse is applied to the 3DXP memory cell for a first period of time and the second setback pulse is applied to the 3DXP memory cell for a second period of time that is shorter than the first period of time. In an embodiment, the method further comprises apply the first setback pulse to the 3DXP memory cell upon a determination that the 3DXP memory cell turned on in response to application of the read voltage. In an embodiment, the 3DXP memory cell is in the crystalline state prior to the application of the read voltage and the method further comprises applying the setback pulse subsequent to or simultaneously with the 3DXP memory cell turning on in response to application of the read voltage and prior to the 3DXP memory cell turning off. In an embodiment, the method further comprises sensing, concurrently with application of the first setback pulse, whether the 3DXP memory cell is in the amorphous state or the crystalline state.

In at least one embodiment, a non-transitory machine readable storage medium includes instructions stored thereon, the instructions when executed by a processor to cause circuitry to apply a read voltage to a three dimensional crosspoint (3DXP) memory cell; and apply a first setback pulse having a first magnitude to the 3DXP memory cell in response to the application of the read voltage, wherein applying the first setback pulse comprises bypassing a current mirror that is to limit or control a magnitude of a second setback pulse applied to the 3DXP memory cell when the current mirror is coupled to the 3DXP memory cell.

In an embodiment, the first setback pulse is applied by coupling a bias voltage to the 3DXP memory cell via a first switch coupled in parallel with the current mirror. In an embodiment, the first switch is enabled by a delayed signal derived from an enable signal coupled to a sense amp that is to sense whether the 3DXP memory cell is in an amorphous state or a crystalline state. In an embodiment, the first setback pulse is to be applied by coupling a bias voltage to the 3DXP memory cell via a first switch coupled between two inputs of a sense amp and a second switch coupling the first switch to the bias voltage. In an embodiment, the first magnitude of the first setback pulse is larger than the second magnitude.

In at least one embodiment, a system comprises means for applying a read voltage to a three dimensional crosspoint (3DXP) cell; and means for applying a first setback pulse having a first magnitude to the 3DXP memory cell in response to the application of the read voltage, wherein applying the first setback pulse comprises bypassing a current mirror that is to limit or control a magnitude of a second setback pulse applied to the 3DXP memory cell when the current mirror is coupled to the 3DXP memory cell.

In an embodiment, the first setback pulse is applied by coupling a bias voltage to the 3DXP memory cell via a first switch coupled in parallel with the current mirror. In an embodiment, the first switch is enabled by a delayed signal derived from an enable signal coupled to a sense amp that is to sense whether the 3DXP memory cell is in an amorphous state or a crystalline state. In an embodiment, the first setback pulse is to be applied by coupling a bias voltage to the 3DXP memory cell via a first switch coupled between two inputs of a sense amp and a second switch coupling the first switch to the bias voltage. In an embodiment, the first magnitude of the first setback pulse is larger than the second magnitude.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
    read circuitry to apply a read voltage to a three dimensional crosspoint (3DXP) memory cell; and
    write setback circuitry to apply a first setback pulse having a first magnitude to the 3DXP memory cell in response to the application of the read voltage, wherein applying the first setback pulse comprises bypassing a current mirror that is to limit or control a magnitude of a second setback pulse applied to the 3DXP memory cell when the current mirror is coupled to the 3DXP memory cell.

2. The apparatus of claim 1, wherein the write setback circuitry is to apply the first setback pulse by coupling a bias voltage to the 3DXP memory cell via a first switch coupled in parallel with the current mirror.

3. The apparatus of claim 2, wherein the first switch is enabled by a delayed signal derived from an enable signal coupled to a sense amp.

4. The apparatus of claim 1, wherein the write setback circuitry is to apply the first setback pulse by coupling a bias voltage to the 3DXP memory cell via a first switch coupled between two inputs of a sense amp and a second switch coupling the first switch to the bias voltage.

5. The apparatus of claim 1, wherein the first magnitude of the first setback pulse is larger than the second magnitude.

6. The apparatus of claim 1, wherein the first magnitude of the first setback pulse scales with a voltage of a wordline select signal applied to a transistor that couples a wordline to the 3DXP memory cell.

7. The apparatus of claim 1, wherein during a setback operation the first setback pulse is applied to the 3DXP memory cell for a first period of time and the second setback pulse is applied to the 3DXP memory cell for a second period of time that is shorter than the first period of time.

8. The apparatus of claim 1, wherein the write setback circuitry is configured to apply the first setback pulse to the 3DXP memory cell upon a determination that the 3DXP memory cell turned on in response to application of the read voltage.

9. The apparatus of claim 1, wherein the 3DXP memory cell is in a crystalline state prior to the application of the read voltage and wherein the write setback circuitry is to apply the first setback pulse subsequent to the 3DXP memory cell turning on in response to application of the read voltage and prior to the 3DXP memory cell turning off.

10. The apparatus of claim 1, further comprising sense circuitry to sense, concurrently with application of the first setback pulse, whether the 3DXP memory cell is in an amorphous state or a crystalline state.

11. A non-transitory machine readable storage medium having instructions stored thereon, the instructions when executed by a processor to cause circuitry to:
    apply a read voltage to a three dimensional crosspoint (3DXP) memory cell; and
    apply a first setback pulse having a first magnitude to the 3DXP memory cell in response to the application of the read voltage, wherein applying the first setback pulse comprises bypassing a current mirror that is to limit or control a magnitude of a second setback pulse applied to the 3DXP memory cell when the current mirror is coupled to the 3DXP memory cell.

12. The medium of claim 11, wherein the first setback pulse is applied by coupling a bias voltage to the 3DXP memory cell via a first switch coupled in parallel with the current mirror.

13. The medium of claim 12, wherein the first switch is enabled by a delayed signal derived from an enable signal coupled to a sense amp that is to sense whether the 3DXP memory cell is in an amorphous state or a crystalline state.

14. The medium of claim 11, wherein the first setback pulse is to be applied by coupling a bias voltage to the 3DXP memory cell via a first switch coupled between two inputs of a sense amp and a second switch coupling the first switch to the bias voltage.

15. The medium of claim 11, wherein the first magnitude of the first setback pulse is larger than the second magnitude.

16. A method comprising:
    applying a read voltage to a three dimensional crosspoint (3DXP) memory cell; and
    applying a first setback pulse having a first magnitude to the 3DXP memory cell in response to the application of the read voltage, wherein applying the first setback pulse comprises bypassing a current mirror that is to limit or control a magnitude of a second setback pulse applied to the 3DXP memory cell when the current mirror is coupled to the 3DXP memory cell.

17. The method of claim 16, wherein the first setback pulse is applied by coupling a bias voltage to the 3DXP memory cell via a first switch coupled in parallel with the current mirror.

18. The method of claim 17, wherein the first switch is enabled by a delayed signal derived from an enable signal coupled to a sense amp that is to sense whether the 3DXP memory cell is in an amorphous state or a crystalline state.

19. The method of claim 16, wherein the first setback pulse is to be applied by coupling a bias voltage to the 3DXP memory cell via a first switch coupled between two inputs of a sense amp and a second switch coupling the first switch to the bias voltage.

20. The method of claim 16, wherein the first magnitude of the first setback pulse is larger than the second magnitude.

\* \* \* \* \*